(12) United States Patent
Oda

(10) Patent No.: US 6,320,264 B1
(45) Date of Patent: Nov. 20, 2001

(54) INTERCONNECT WIRING WITH SIDEWALLS AND INTER-WIRING INSULATION COMPOSED OF FLUORINE

(75) Inventor: Noriaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/323,124

(22) Filed: Jun. 1, 1999

(30) Foreign Application Priority Data

Jun. 2, 1998 (JP) .................................................. 10-152731

(51) Int. Cl.[7] .................................................. H01L 23/48
(52) U.S. Cl. .................... 257/758; 257/750; 257/650; 257/748
(58) Field of Search .................... 257/408, 344, 257/410, 336, 411, 758, 750, 650, 700, 748

(56) References Cited

U.S. PATENT DOCUMENTS

| | | | | |
|---|---|---|---|---|
| 5,446,311 | * | 8/1995 | Ewen et al. ........................... | 257/508 |
| 5,654,237 | * | 8/1997 | Suguro et al. ........................ | 438/624 |
| 5,831,319 | * | 11/1998 | Pan ....................................... | 257/408 |
| 6,197,631 | * | 3/2001 | Ishihara ................................ | 438/240 |

FOREIGN PATENT DOCUMENTS

| | | |
|---|---|---|
| 3-97247 | 4/1991 | (JP) . |
| 8-64679 | 3/1996 | (JP) . |
| 8-115976 | 5/1996 | (JP) . |
| 8-172132 | 7/1996 | (JP) . |
| 9-102492 | 4/1997 | (JP) . |
| 10-22389 | 1/1998 | (JP) . |
| 10-56009 | 2/1998 | (JP) . |
| 10-144670 | 5/1998 | (JP) . |

OTHER PUBLICATIONS

"Consideration of Materials for Porous Interlayer Insulating Film", Proceedings of the 52th Symposium on Semiconductor and Integrated Circuits Technology, p. 62–67 (1997), Aoi, et al., with English Abstract.

* cited by examiner

*Primary Examiner*—Fetsum Abraham
(74) *Attorney, Agent, or Firm*—Sughrue, Mion, Zinn, Macpeak & Seas, PLLC

(57) ABSTRACT

A semiconductor device comprises a wiring in each of one or more wiring layers formed on a semiconductor substrate, and wiring sidewall layers which are formed on side edge portions of the wiring and which include fluorine-containing silicon oxide. It is possible to form an inter-wiring insulating film comprising fluorine-containing silicon oxide or Hydroxy Silsesquioxane on the outer surface of the wiring sidewall layers. Further, it is possible to form thermally diffused regions of fluorine into which fluorine is thermally diffused from the wiring sidewall layers in the inter-wiring insulating layer and near the interfaces with the wiring sidewall layers.

19 Claims, 11 Drawing Sheets

A) First Embodiment
B) Prior Art (Between SiOF layers having uniform high fluorine concentration)
C) Prior Art (Between SiOF layers having uniform ordinary fluorine concentration)

● Capacitance between Wirings
○ Number of Occurrence of Delamination

PRIOR ART

PRIOR ART

INTERCONNECT WIRING WITH SIDEWALLS AND INTER-WIRING INSULATION COMPOSED OF FLUORINE

FIELD OF THE INVENTION

The present invention relates generally to semiconductor devices and method of manufacturing them, and more particularly to semiconductor devices and method of manufacturing them in which capacitance between wirings can be reduced, delamination of inter-wiring insulating films can be suppressed and complication of manufacturing process can be avoided.

BACKGROUND OF THE INVENTION

As semiconductor devices are integrated in a high density, and circuit patterns of the semiconductor devices become minute, spaces between wirings become narrow. As spaces between wirings become narrow, parasitic capacitance between adjacent wirings increases, so that operation speed of circuits becomes slower and power consumption of the circuits becomes large.

In order to effectively decrease the parasitic capacitance, a technique is proposed in which an insulating film disposed between wirings, such as an interlayer insulating film of a multi-layered wirings and the like, is formed by using material having low dielectric constant or permittivity. For example, in each of Japanese patent laid-open publication No. 3-97247, Japanese patent laid-open publication No. 8-115976 and Japanese patent laid-open publication No. 9-102492, a semiconductor device having multi-layered wiring structure as schematically shown in FIG. 10 is disclosed.

In the conventional semiconductor device shown in FIG. 10, a first layer wiring 205, a second layer wiring 206 and a third layer wiring 207 are provided on a semiconductor substrate 201 at three height regions 202, 203 and 204 having different heights from the semiconductor substrate 201, respectively. Among these wirings, for example, between the first layer wirings 205, between the second layer wirings 206 and on each of these wirings 205 and 206, there are provided interlayer insulating films 208 which comprise fluorine-containing silicon oxide (SiOF).

Also, as shown in FIG. 11 in which like reference numerals designate identical or corresponding components, another prior art semiconductor device is proposed in which, instead of the above-mentioned interlayer insulating films 208, insulating films 209 comprising Hydroxy Silsesquioxane are used in combination with, for example, plasma oxidation oxide films 210. The Hydroxy Silsesquioxane is a kind of inorganic Spin On Glass (SOG) which has heat resistance of approximately 400 degrees Celsius and which has relative dielectric constant of approximately 3.0. In the structure of FIG. 11, wiring sidewall layers 212 comprising silicon oxide are formed on side wall portions of wiring layers 205 and 206.

When, as shown in FIG. 10, the interlayer insulating films 208 are formed by using the fluorine-containing silicon oxide, however, it is necessary to make the content or concentration of fluorine in the interlayer insulating films 208, for example, equal to or larger than 7 weight percent, in order to decrease the relative dielectric constant to, for example, 3.0 through 3.5 and thereby to decrease parasitic capacitance between wirings. However, when the interlayer insulating films 208 are formed by using the fluorine-containing silicon oxide which contains such a large amount of fluorine, delamination is prone to occur at the interface portion having large area, especially, for example, between the semiconductor substrate 201, the plasma oxidation film 211 formed between the interlayer insulating films 208, or the like and the interlayer insulating film 208. Therefore, manufacturing yield of semiconductor devices deteriorates in this structure.

With respect to the semiconductor device shown in FIG. 11, the SOG film 209 made of inorganic material such as the Hydroxy Silsesquioxane and the like as used in this device has a relative dielectric constant higher than that of an insulating film of organic material. Therefore, in order to decrease the parasitic capacitance between wirings, it is required to further reduce the relative dielectric constant of this inorganic SOG film 209. For this purpose, for example, in a thesis "Consideration of Materials for Porous Interlayer Insulating Film", Proceedings of the 52th Symposium on Semiconductor and Integrated Circuits Technology, p. 62–67 (1997), Aoi, et al., a technique is proposed wherein silylating agent is applied to SOG solution to silylate it and the silylated SOG solution is treated with an amine. Thereby, relative dielectric constant is reduced to approximately 2.3, and also pore size can be reduced to obtain low hygroscopic characteristics. However, in this method, treatment of the SOG solution takes time and labor, and the SOG solution becomes unstable.

SUMMARY OF THE INVENTION

Therefore, it is an object of the present invention to improve the above-mentioned disadvantages of the prior arts.

It is another object of the present invention to decrease parasitic capacitance between wirings in a semiconductor device highly integrated and having minute patterns.

It is another object of the present invention to avoid delamination of insulating films between wirings in a semiconductor device highly integrated and having minute patterns.

It is another object of the present invention to decrease parasitic capacitance between wirings in a semiconductor device highly integrated and having minute patterns, without causing disadvantages such as complication of manufacturing process.

It is another object of the present invention to avoid delamination of insulating films between wirings in a semiconductor device highly integrated and having minute patterns, without causing disadvantages such as complication of manufacturing process.

According to one aspect of the present invention, there is provided a semiconductor device comprising: a wiring in each of one or more wiring layers formed on a semiconductor substrate; and wiring sidewall layers which are formed on side edge portions of the wiring and which include fluorine-containing silicon oxide.

In this case, the one or more wiring layers may comprise a plurality of wiring layers which are respectively disposed in height regions having different heights from the semiconductor substrate.

Also, each of the wiring sidewall layers may have a double layer structure having an inner wall layer comprising silicon oxide and formed on the side edge portions of the wiring and an outer wall layer comprising fluorine-containing silicon oxide and formed on the outer surface of said inner wall layer.

It is also possible to form an inter-wiring insulating film comprising fluorine-containing silicon oxide on the outer surface of the wiring sidewall layers.

Further, it is possible to form thermally diffused regions of fluorine into which fluorine is thermally diffused from the wiring sidewall layers in the inter-wiring insulating layer and near the interfaces with the wiring sidewall layers.

It is further possible to form an inter-wiring insulating film comprising Hydroxy Silsesquioxane the outer surfaces of the wiring sidewall layers.

It is further possible to form thermally diffused regions of fluorine into which fluorine is thermally diffused from the wiring sidewall layers and in which said Hydroxy Silsesquioxane is dehydrogenated and density of the Hydroxy Silsesquioxane is lowered, in the inter-wiring insulating layer and near the interfaces with the wiring sidewall layers.

According to another aspect of the present invention, there is provided a method of manufacturing a semiconductor device comprising: providing a semiconductor substrate; forming an insulating layer on the semiconductor substrate; forming a conductor layer for forming wirings in a wiring layer on the semiconductor substrate on which the insulating layer is formed; patterning the conductor layer for forming wirings to form wirings which are disposed in predetermined patterns; forming a film layer for forming wiring sidewall layers including fluorine-containing silicon oxide on the semiconductor substrate so as to cover the wirings; etching back the film layer for forming wiring sidewall layers to form wiring sidewall layers including fluorine-containing silicon oxide on side edge portions of the wirings; and forming an inter-wiring insulating layer comprising fluorine-containing silicon oxide on the semiconductor substrate so as to cover the wirings and the wiring sidewall layers.

This method may further comprise: thermally diffusing fluorine included in the wiring sidewall layers into the inter-wiring insulating film, and forming thermally diffused regions of fluorine into which fluorine is thermally diffused from the wiring sidewall layers and which are formed in the inter-wiring insulating layer and near the interfaces with the wiring sidewall layers.

According to still another aspect of the present invention, there is provided a method of manufacturing a semiconductor device comprising: providing a semiconductor substrate; forming an insulating layer on the semiconductor substrate; forming a conductor layer for forming wirings in a wiring layer on the semiconductor substrate on which the insulating layer is formed; patterning the conductor layer for forming wirings to form wirings which are disposed in predetermined patterns; forming a film layer for forming wiring sidewall layers including fluorine-containing silicon oxide on the semiconductor substrate so as to cover the wirings; etching back the film layer for forming wiring sidewall layers to form wiring sidewall layers including fluorine-containing silicon oxide on side edge portions of the wirings; and forming an inter-wiring insulating layer comprising Hydroxy Silsesquioxane on the semiconductor substrate so as to cover said wirings and the wiring sidewall layers.

Also, this method may further comprise: thermally diffusing fluorine included in the wiring sidewall layers into the inter-wiring insulating film, and forming thermally diffused regions of fluorine in which the Hydroxy Silsesquioxane is dehydrogenated and density of the Hydroxy Silsesquioxane is lowered and which are formed in the inter-wiring insulating layer and near the interfaces with said wiring sidewall layers.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
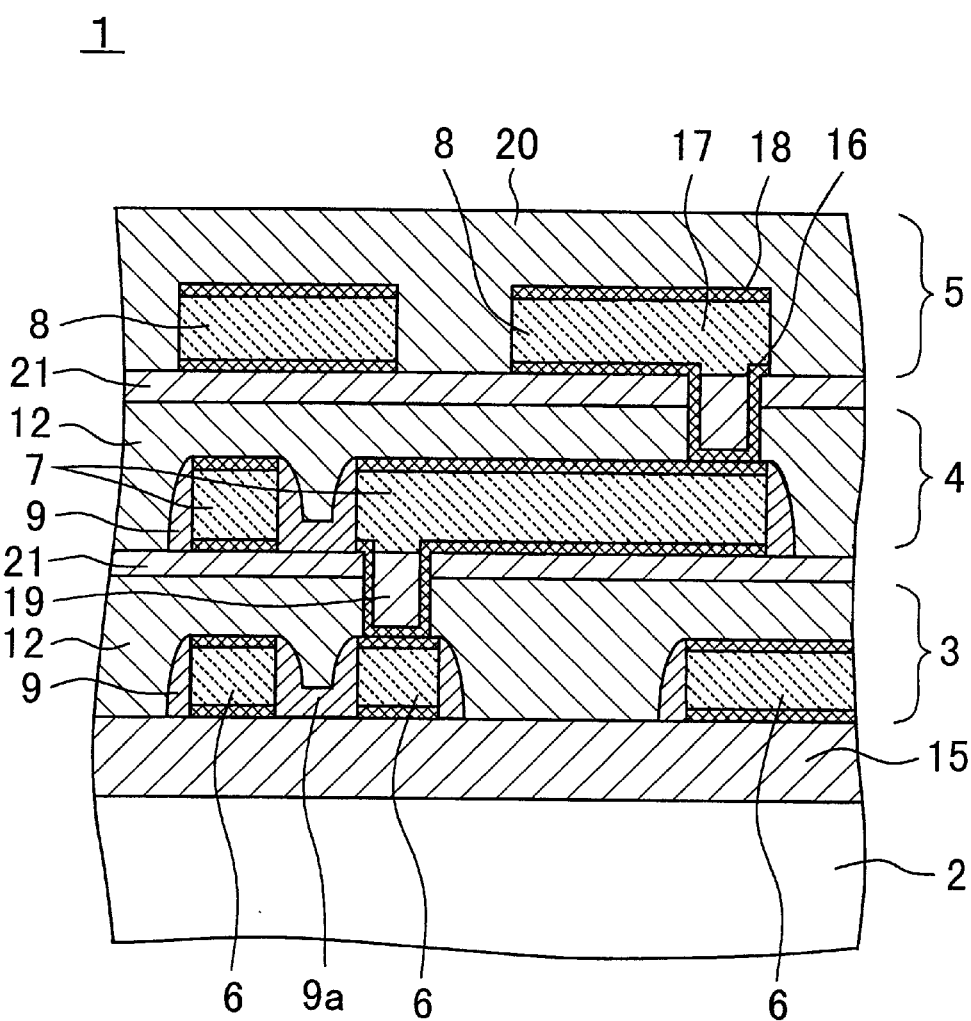
FIG. 1 is a partial cross sectional view illustrating a structure of a semiconductor device according to an embodiment of the present invention.

The semiconductor devices and method of manufacturing them according to the present invention have the constitutions as outlined above, and one of characteristic features thereof resides in that wiring sidewall layers including fluorine-containing silicon oxide are formed on side edge portions of each wiring formed on a semiconductor substrate. Thereby, parasitic capacitance between wirings can be decreased by the wiring sidewall layers. Therefore, when, for example, an inter-conductor or inter-wiring insulating layer comprising the fluorine-containing silicon oxide is formed between such wirings, it is possible to raise fluorine concentration in the wiring sidewall layers to decrease parasitic capacitance between wirings and to lower fluorine concentration of the inter-wiring insulating layer to avoid delamination of the inter-wiring insulating layer. In this case, the wiring sidewall layers themselves do not contact, for example, the semiconductor substrate in large area, and, therefore, do not cause delamination.

Also, when an inter-wiring insulating film or layer comprising Hydroxy Silsesquioxane is formed between the wirings, it is possible to raise fluorine concentration in the wiring sidewall layers and to decrease the dielectric constant of the wiring sidewall layers themselves. Therefore, it is not necessary to perform improvement process of the quality of the Hydroxy Silsesquioxane itself which incurs complication of manufacturing process.

With reference to the drawings, embodiments of the semiconductor device and manufacturing method according to the present invention will now be described in detail.

FIG. 1 through FIG. 4 are partial cross sectional views illustrating various structures of a semiconductor device 1 having so called multi-layered wiring structure, as embodiments of a semiconductor device according to the present invention. In the semiconductor device shown in each of these drawings, there are provided, on a semiconductor substrate 2, wirings 6 formed by a first wiring layer, wirings 7 formed by a second wiring layer and wirings 8 formed by a third wiring layer at three height regions 3, 4 and 5 having different heights from the semiconductor substrate 2, respectively. Among the wirings 6, 7 and 8, wiring sidewall layers 9 including fluorine containing silicon oxide are formed on side edge portions of, for example, each of the wirings 6 and 7. It should be noted that the semiconductor device according to the present invention is not limited to those having multi-layered wiring structure shown in FIG. 1 through FIG. 4, but can be a semiconductor device in which a wiring layer is formed in only one height region on a semiconductor substrate. Also, there is no limitation on the number of the height regions in the multi-layered wiring structure.

With respect to the parasitic capacitance between wirings in a semiconductor device having multi-layered wiring structure, the capacitance between wirings within the same height region is usually prominent, and the capacitance between wirings in different height regions is relatively small. Therefore, it is more important to decrease the capacitance between wirings within the same height region.

In the semiconductor device according to the present invention, it is possible to decrease parasitic capacitance between wirings within the same height region, by including fluorine-containing silicon oxide having low dielectric constant in the wiring sidewall layers 9. Relative dielectric constant of a silicon oxide which does not contain fluorine is approximately 4 or so. On the other hand, by including approximately 7 through 11 atomic percent fluorine in silicon oxide, it is possible to reduce relative dielectric constant to approximately 3.0 through 3.5.

Figure 2:
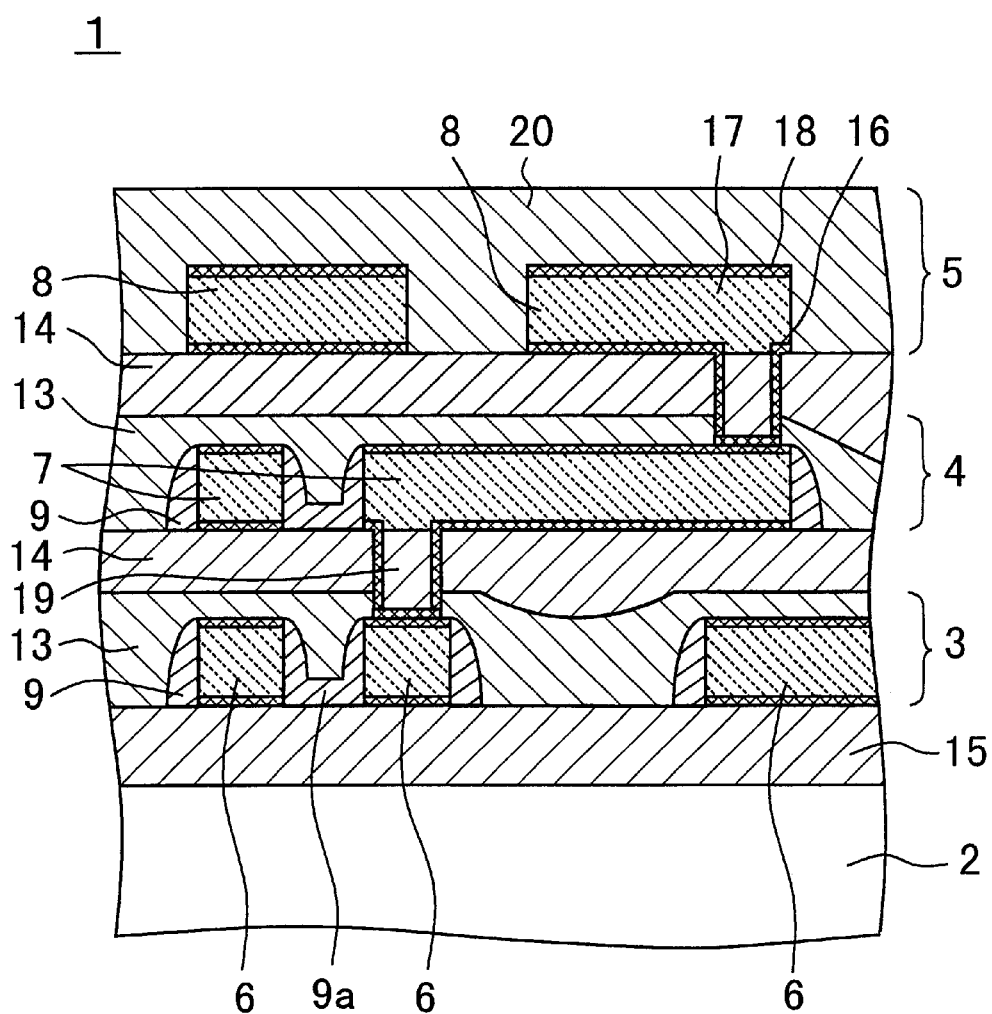
FIG. 2 is a partial cross sectional view illustrating a structure of a semiconductor device according to another embodiment of the present invention.

As shown in FIG. 1 and FIG. 2, it is possible to constitute the wiring sidewall layers 9 only by the fluorine-containing silicon oxide. In such constitution, it is appropriate to set the thickness of each of the wiring sidewall layers 9 in the direction perpendicular to the interface between the wiring sidewall layer 9 and the wiring 6 or 7, especially the said thickness at the portion in which a wiring opposes another wiring within the same height region, to approximately 20 through 100 nanometers. Also, as shown, for example, in FIG. 1 and FIG. 2, adjacent wiring sidewall layers 9 may have a portion 9a which is continuously formed between the adjacent wiring side wall layers 9.

Figure 3:
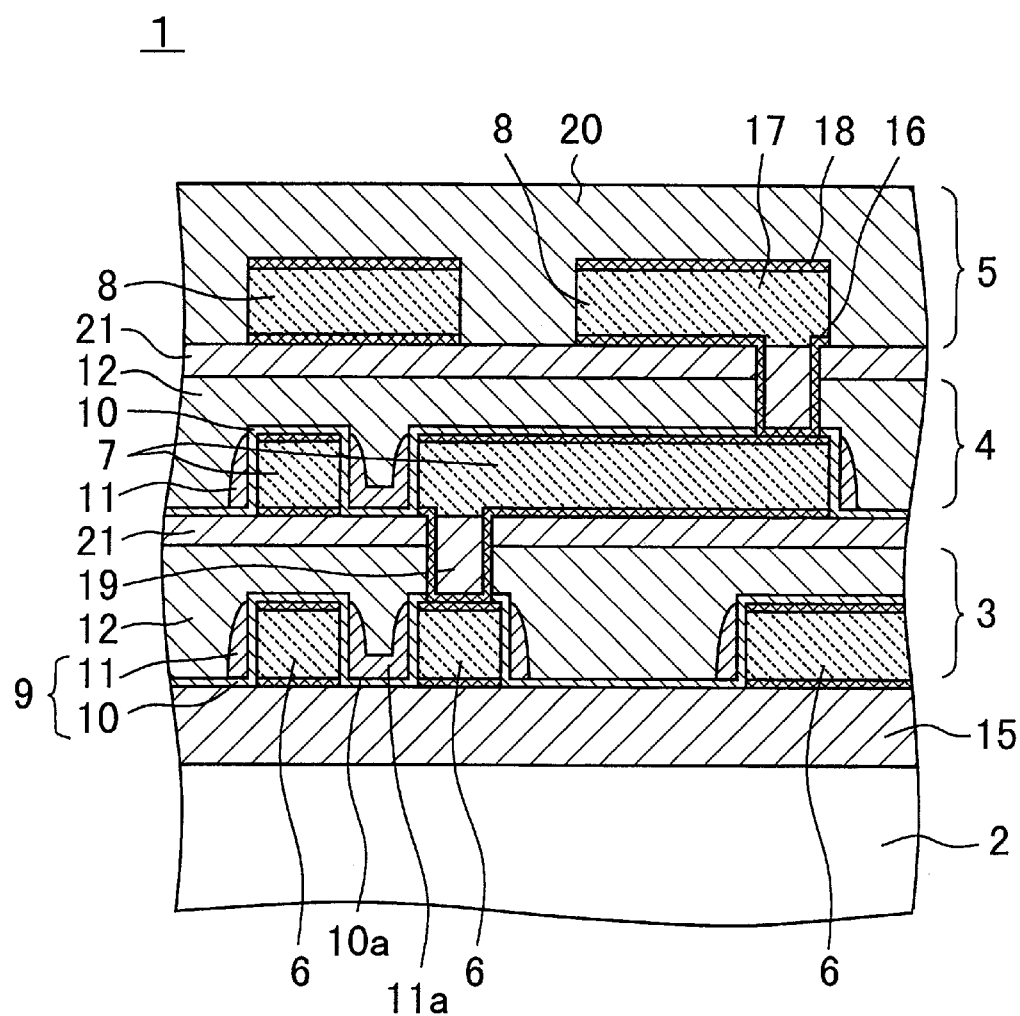
FIG. 3 is a partial cross sectional view illustrating a structure of a semiconductor device according to still another embodiment of the present invention.
Figure 4:
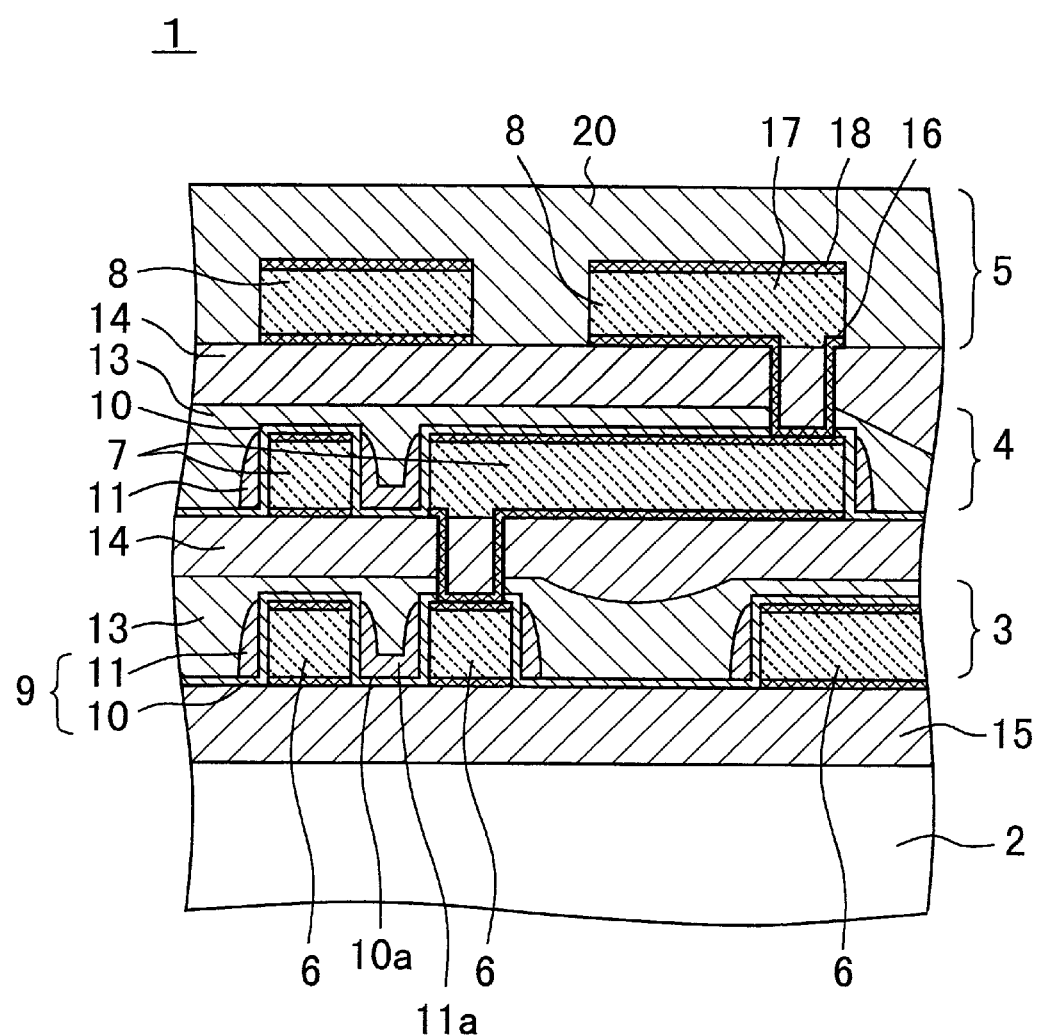
FIG. 4 is a partial cross sectional view illustrating a structure of a semiconductor device according to still another embodiment of the present invention.

Also, as shown, for example, in FIG. 3 and FIG. 4, each of the wiring sidewall layers 9 may have two layer structure comprising an inner wall layer 10 and an outer wall layer 11. The inner wall layer 10 is made of silicon oxide, is formed on the side edge portions of the wirings 6 and 7, and has a thickness approximately equal to or smaller than 100 nanometers in the direction perpendicular to the interface with the wirings 6 and 7. The inner wall layer 10 is formed, for example, by plasma oxidation, and serves to avoid corrosion of the wirings 6 and 7 by fluorine. The outer wall layer 11 is formed on the outer surface of the inner wall layer 10 and comprises fluorine-containing silicon oxide. In this case, it is appropriate that the outer wall layer 11 has a thickness of approximately 20 through 100 nanometers in the direction perpendicular to the interface with the inner layer 10. Also, as shown, for example, in FIG. 3 and FIG. 4, adjacent inner wall layers 10 or outer wall layers 11 may have a portion 10a or 11a which is continuously formed between the adjacent wiring sidewall layers 9.

In each of the height regions 3 and 4, an inter-wiring insulating film such as an interlayer film and so on is formed between wirings 6 and between wirings 7, which wirings 6 and 7 have the wiring sidewall layers 9 including fluorine-containing silicon oxide formed at the side edge portions thereof. In the examples of FIG. 1 and FIG. 3, inter-wiring insulating films 12 comprising fluorine-containing silicon oxide are formed on the outer surface of the wiring sidewall layers 9, as inter-wiring insulating films each of which functions both as an insulating film between wirings of different height regions and as an insulating film between wirings within the same height region. In order to avoid delamination mentioned before, fluorine concentration in the inter-wiring insulating film 12 is preferably lower than that in the fluorine-containing silicon oxide included in the wiring sidewall layers 9, and, more preferably, the fluorine concentration in the inter-wiring insulating film 12 is approximately 3 through 7 atomic percent. In the example of FIG. 2 and FIG. 4, an inter-wiring insulating film 13 comprising Hydroxy Silsesquioxane is formed on the outer surface of the wiring sidewall layers 9, as an insulating film between wirings within the same height region, and, further, an interlayer insulating film 14 comprising a plasma oxidation film is formed on the inter-wiring insulating film 13.

In a preferred mode of the present invention, in the examples of FIG. 1 and FIG. 3, the wiring sidewall layers 9 are heated, during process steps for manufacturing a semiconductor device according to the present invention, for example, during heat treatment and the like, such as heat treatment in hydrogen atmosphere performed for stabilizing a threshold voltage of each transistor, a CVD process for forming a tungsten layer, a plasma CVD process for forming an oxide film, and so on. By such heating, thermal diffusion of fluorine occurs from the wiring sidewall layers 9 having relatively high fluorine concentration into the inter-wiring insulating film 12 having low fluorine concentration. Thereby, thermally diffused regions having high fluorine concentration, for example, 7 through 9 atomic percent, are formed in the inter-wiring insulating layer 12 and near the interface between the inter-wiring insulating layer 12 and the wiring sidewall layers 9. In this case, it is preferable that the fluorine concentration in the thermally diffused regions gradually increases toward the interface with the wiring sidewall layers 9. If the fluorine concentration has such distribution, adhesion between the wiring sidewall layers 9 and the inter-wiring insulating film 12 is improved and occurrence of delamination can be suppressed. Also, it is preferable that the thermally diffused regions are formed with the thickness equal to or smaller than approximately 300 nanometers from the interface with the wiring sidewall layers 9.

In another preferred mode of the present invention, in the examples of FIG. 2 and FIG. 4, the wiring sidewall layers 9 are heated, during process steps for manufacturing a semiconductor device according to the present invention, similarly as mentioned above. By such heating, thermal diffusion of fluorine occurs, and thermally diffused regions in which dehydrogenation of Hydroxy Silsesquioxane has occurred and density thereof is lowered are formed in the inter-wiring insulating layer 13 comprising the Hydroxy Silsesquioxane and near the interface between the inter-wiring insulating layer 13 and the wiring sidewall layers 9. In the thermally diffused regions, since the density of Hydroxy Silsesquioxane is lowered, dielectric constant is also decreased. This decrease in dielectric constant contributes to reduction of parasitic capacitance between wirings. It is preferable that density of the Hydroxy Silsesquioxane in the thermally diffused regions gradually decreases toward the interface with the wiring sidewall layers 9. If the density has such distribution, adhesion between the wiring sidewall layers 9 and the inter-wiring insulating film 13 is improved and occurrence of delamination can be further suppressed. Also, it is preferable that the thermally diffused regions are formed with the thickness equal to or smaller than approximately 300 nanometers from the interface with the wiring sidewall layers 9.

In the structures of FIG. 1 through FIG. 4, a reference numeral 15 designates an insulating film formed on the semiconductor substrate 2, and reference numerals 16, 17 and 18 designate a layer comprising refractory metal, a layer comprising an alloy containing aluminum and a layer comprising refractory metal containing titanium, respectively. These layers 16, 17 and 18 are components constituting each of the wirings 6, 7 and 8. Also, a reference numeral 19 designates a via hole wiring comprising tungsten for inter-coupling the wirings 6, 7 and 8, a reference numeral 20 designates a cover film comprising, for example, polyimide and the like, and a reference numeral 21 designates an interlayer insulating film which comprises an oxide film formed by plasma oxidation and which is formed on the inter-wiring insulating film 12 comprising silicon oxide that contains fluorine. However, in the present invention, structure, material and so on of these wirings, insulating films and the like are not limited to those mentioned above. Also, in the structures of FIGS. 1–4, the wiring sidewall layers 9 are not provided in the highest height region. This is because, in the highest height region such as the height region 5, wirings are usually not disposed close to each other and therefore parasitic capacitance between wirings does not cause any problem. However, if necessary, it is possible to form the wiring sidewall layers 9 and the inter-wiring insulating films 12 or 13 in the highest height region 5 in a manner similar to other height regions 3 and 4.

With reference to FIGS. 5A and 5B and FIGS. 6A and 6B, process steps for fabricating the wirings 6 in the height region 3, shown in FIG. 1, will now be described, as an example of a method of manufacturing a semiconductor device according to the present invention.

Figure 5A:
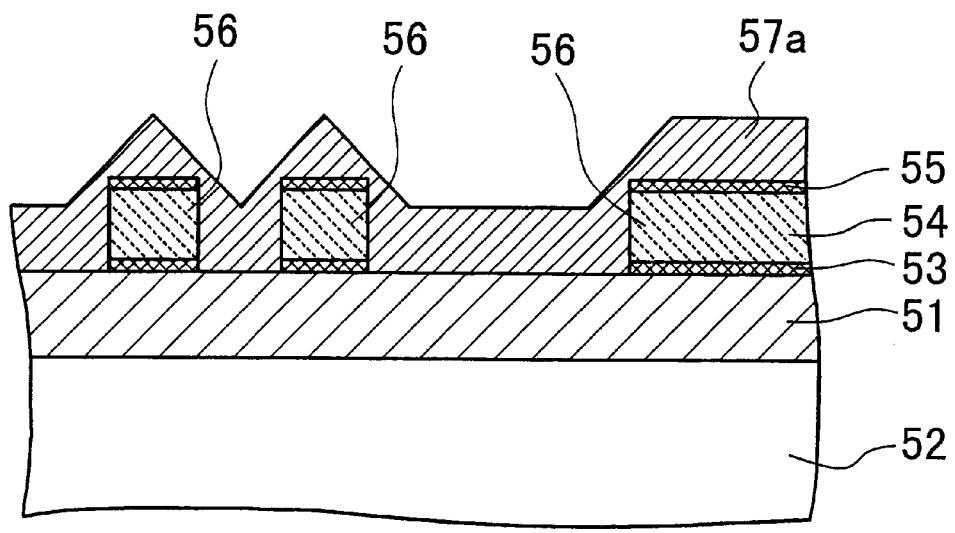
FIG. 5A and FIG. 5B are partial cross sectional views illustrating process steps for manufacturing a semiconductor device in accordance with an embodiment of the present invention.

First, as shown in FIG. 5A, a semiconductor substrate 52 on whose surface layer portion an insulating film 51 is formed is prepared. For example, by a sputtering method, a refractory metal film portion 53, an alloy film portion 54 and a refractory metal film portion 55 are sequentially formed and stacked on the semiconductor substrate 52. The refractory metal film portion 53 comprises a double layer structure of a titanium film having a thickness of, for example, 30 nanometers and a titanium nitride film having a thickness of, for example, 50 nanometers. The alloy film portion 54 comprises an alloy which contains aluminum, for example, an alloy of Al and Cu, that is, $Al_{1-x}Cu_x$, and has a thickness of, for example, 0.5 micrometers. The refractory metal film portion 55 comprises refractory metal including titanium, for example, titanium nitride and the like, and has a thickness of, for example, 50 nanometers.

Then, the film portions 53, 54 and 55 of the stacked structure are patterned by, for example, photolithography and reactive ion etching, and thereby wirings 56 disposed on the semiconductor substrate 52 and having predetermined patterns are formed. Thereafter, a film portion 57a, which is used for forming wiring sidewalls, which comprises, for example, silicon oxide that contains fluorine, and which has a thickness of, for example, 0.6 micrometers, is formed on the semiconductor substrate 52 so as to cover the wirings 56. The film portion 57a is formed, for example, by using a bias-electron cyclotron resonance method, wherein plasma CVD is performed using ECR (electron cyclotron resonance), while simultaneously performing sputter etching, or while simultaneously performing etching by Ar plasma and the like in a condition a bias voltage is applied. By using such method, it is possible to form the film portion 57a having enough thickness between closely adjacent wirings 56.

Figure 5B:
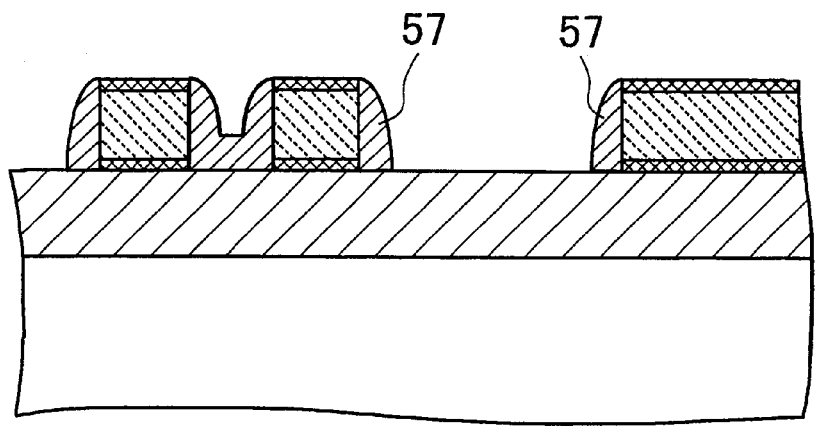

Then, as shown in FIG. 5B, the film portion 57a is etched back to form wiring sidewall layers 57 at side edge portions of the wirings 56.

Figure 6A:
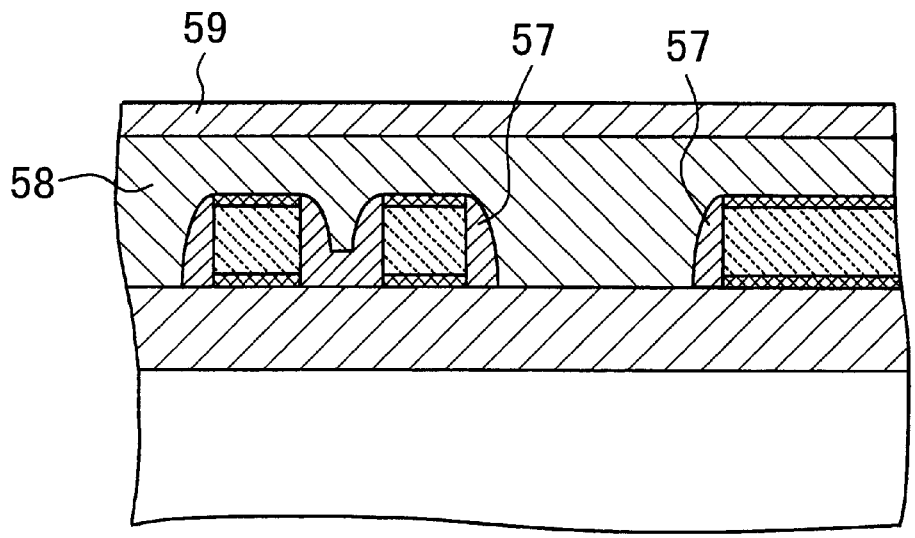
FIG. 6A and FIG. 6B are partial cross sectional views illustrating process steps for manufacturing a semiconductor device performed after the process steps illustrated in FIG. 5A and FIG. 5B.

Thereafter, as shown in FIG. 6A, an inter-wiring insulating layer 58 comprising fluorine-containing silicon oxide is formed to a thickness of, for example, 1.5 micrometers by using, for example, parallel plate plasma CVD or by using the above-mentioned bias-electron cyclotron resonance method. Then, the surface of the inter-wiring insulating layer 58 is planarized by CMP. A plasma oxidation film 59 is then formed on the inter-wiring insulating film 58 by the thickness of, for example, approximately 0.2 micrometers, such that thickness of an insulating film on the wirings 56 becomes approximately 0.5 micrometers.

Figure 6B:
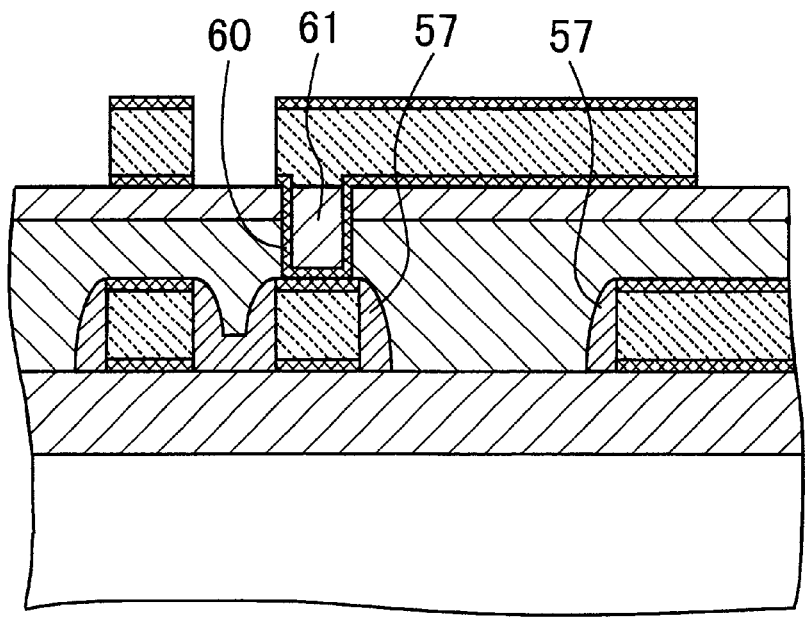

Further, as shown in FIG. 6B, via holes are made at predetermined locations in the insulating films 58 and 59 by using photolithography and etching. Then, a titanium layer having a thickness of 30 nanometers and a titanium nitride layer having a thickness of 50 nanometers are sequentially formed by using, for example, a sputtering method. Thereby, a refractory metal film structures 60 having a double layer structure comprising the titanium film and titanium nitride film are formed. Thereafter, by using, for example, CVD, a tungsten film is formed on the semiconductor substrate 52 and the tungsten film is etched back or polished back, to fill the via holes with tungsten. Thereby, wirings 61 of the via hole portions are formed, and thus formation of a wiring structure of the first height region is completed. With respect to the second height region and other height region or regions thereafter, wirings 56, wiring sidewall layers 57, insulating layers 58 and 59, and via hole wirings 61 can be formed in a manner similar to those of the first height region. Thereby, the semiconductor device having multi-layered wiring structure as shown in FIG. 1 can be fabricated.

With reference to FIGS. 7A and 7B and FIGS. 8A and 8B, process steps for fabricating the wirings 6 in the height region 3 shown in FIG. 2 will now be described, as another example of a method of manufacturing a semiconductor device according to the present invention.

Figure 7A:
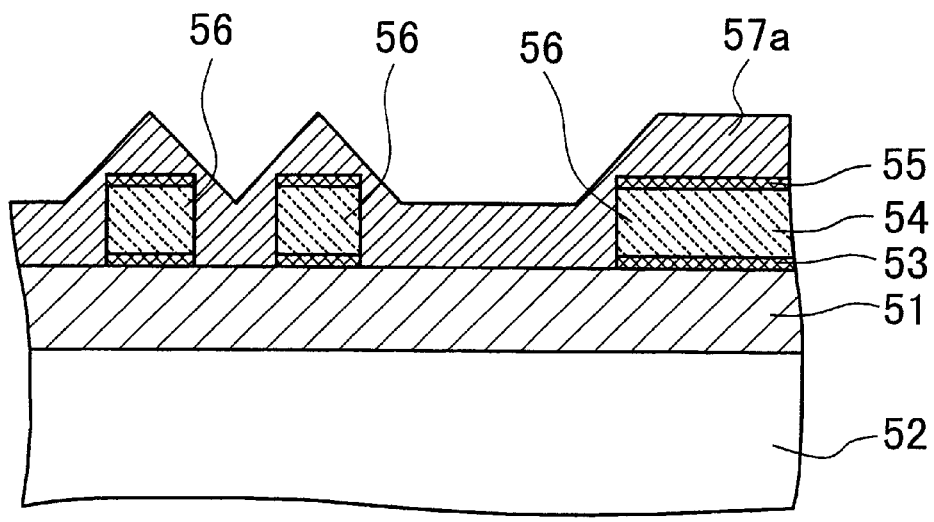
FIG. 7A and FIG. 7B are partial cross sectional views illustrating process steps for manufacturing a semiconductor device in accordance with another embodiment of the present invention.
Figure 7B:
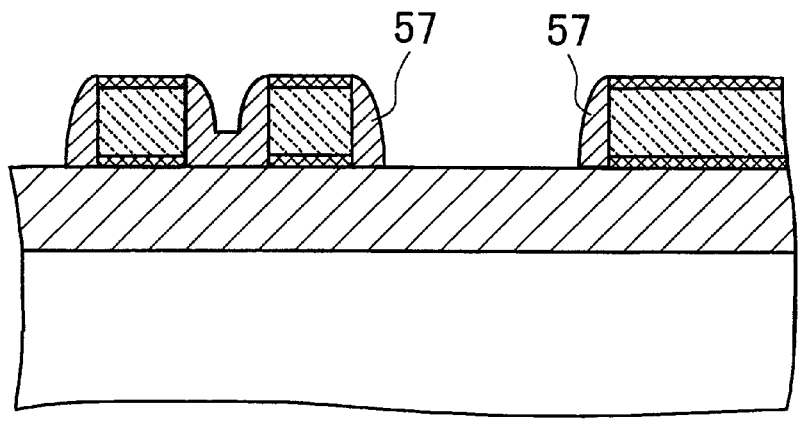

First, process steps illustrated in FIGS. 7A and 7B are performed similarly to those described above with reference to FIGS. 5A and 5B.

That is, as shown in FIG. 7A, a semiconductor substrate 52 on whose surface layer portion an insulating film 51 is formed is prepared. For example, by a sputtering method, a refractory metal film portion 53, an alloy film portion 54 and a refractory metal film portion 55 are sequentially formed and stacked on the semiconductor substrate 52. The refractory metal film portion 53 comprises a double layer structure of a titanium film having a thickness of, for example, 30 nanometers and a titanium nitride film having a thickness of, for example, 50 nanometers. The alloy film portion 54 comprises an alloy which contains aluminum, for example, an alloy of Al and Cu, that is, $Al_{1-x}Cu_x$, and has a thickness of, for example, 0.5 micrometers. The refractory metal film portion 55 comprises refractory metal including titanium, for example, titanium nitride and the like, and has a thickness of, for example, 50 nanometers. hen, the film portions 53, 54 and 55 of the stacked structure are patterned by, for example, photolithography and reactive ion etching, and thereby wirings 56 disposed on the semiconductor substrate 52 and having predetermined patterns are formed. Thereafter, a film portion 57a, which is used for forming wiring sidewalls, which comprises, for example, silicon oxide that contains fluorine and which has a thickness of, for example, 0.6 micrometers, is formed on the semiconductor substrate 52 so as to cover the wirings 56. The film portion 57a is formed, for example, by using a bias-electron cyclotron resonance method, wherein plasma CVD is performed using ECR (electron cyclotron resonance), while simultaneously performing sputter etching, or while simultaneously performing etching by Ar plasma and the like in a condition a bias voltage is applied. By using such method, it is possible to form the film portion 57a having enough thickness between closely adjacent wirings 56.

Then, as shown in FIG. 7B, the film portion 57a is etched back to form wiring sidewall layers 57 at side edge portions of the wiring layers 56.

Figure 8A:
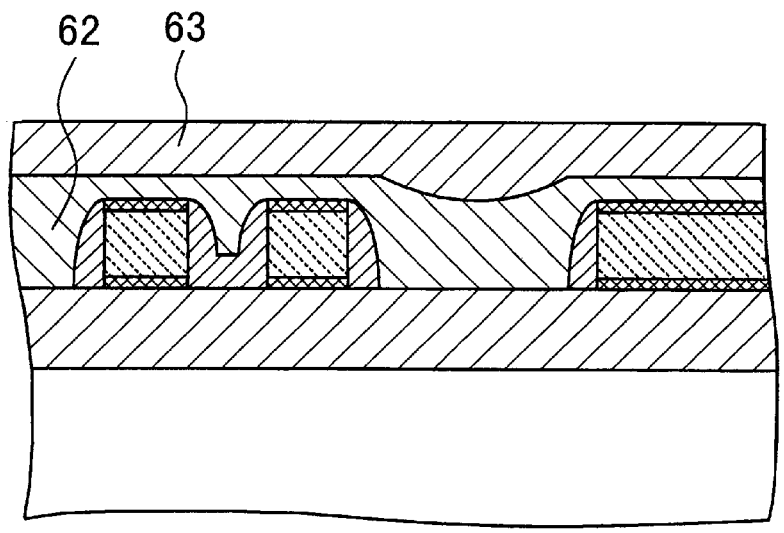
FIG. 8A and FIG. 8B are partial cross sectional views illustrating process steps for manufacturing a semiconductor device performed after the process steps illustrated in FIG. 7A and FIG. 7B.

Thereafter, as shown in FIG. 8A, an inter-wiring insulating layer 62 comprising Hydroxy Silsesquioxane is formed to a thickness of, for example, 1.5 micrometers, by using spin coating and heat treatment, for example, in nitrogen atmosphere, 350 through 450 degrees Celsius, one hour. A plasma oxidation film 63 is then formed on the inter-wiring insulating film 63 by the thickness of, for example, approximately 1.5 micrometers, and the surface of the plasma oxidation film 63 is planarized by CMP.

Figure 8B:
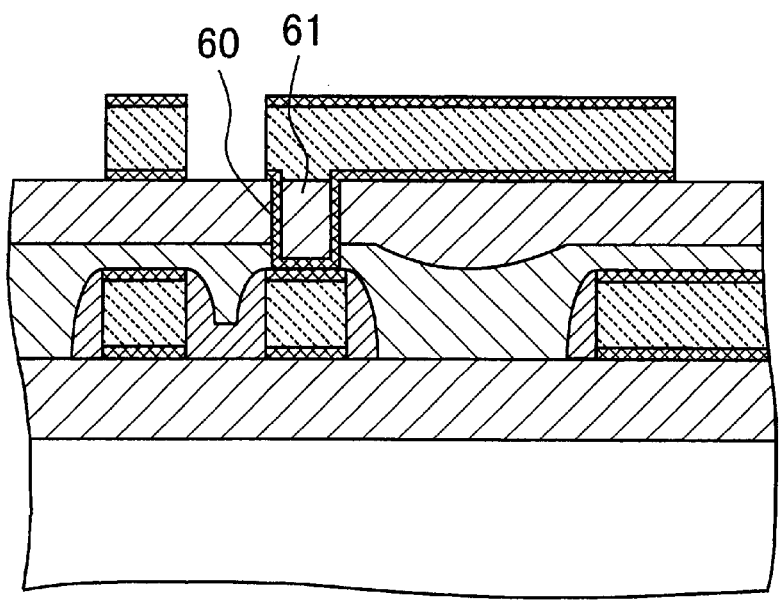

Further, as shown in FIG. 8B, via holes are made at predetermined locations in the insulating films 62 and 63 by using photolithography and etching. Then, a titanium layer having a thickness of 30 nanometers and a titanium nitride layer having a thickness of 50 nanometers are sequentially formed by using, for example, a sputtering method. Thereby, a refractory metal film structures 60 having a double layer structure comprising the titanium film and titanium nitride film are formed. Thereafter, by using, for example, CVD, a tungsten film is formed on the semiconductor substrate 52 and the tungsten film is etched back or polished back, to fill the via holes with tungsten. Thereby, wirings 61 of the via hole portions are formed, and thus formation of a wiring structure of the first height region is completed. With respect to the second height region and other height region or regions thereafter, wirings 56, wiring sidewall layers 57, insulating layers 58 and 59, and via hole wirings 61 can be formed in a manner similar to those of the first height region. Thereby, the semiconductor device having multi-layered wiring structure as shown in FIG. 2 can be fabricated.

In a preferred mode of the present invention, in the examples of FIGS. 5A and 5B and FIGS. 6A and 6B, the wiring sidewall layers 57 are heated at a temperature equal to or higher than, for example, 400 degrees Celsius, in a heat treatment process during process steps for manufacturing a semiconductor device according to the present invention. Examples of such heat treatment processes are heat treatment in hydrogen atmosphere performed for stabilizing a threshold voltage of each transistor formed on the semiconductor substrate, a tungsten CVD process for forming wirings of via hole portions, a plasma CVD process for forming an oxide film, and so on. Due to such heating, thermal diffusion of fluorine occurs from the wiring sidewall layers 57 having relatively high fluorine concentration into the inter-wiring insulating film 58 having low fluorine concentration. Thereby, thermally diffused regions having high fluorine concentration, for example, 7 through 9 atomic percent, are formed in the inter-wiring insulating layer 58 comprising silicon oxide which includes fluorine and near the interface between the inter-wiring insulating layer 58 and the wiring sidewall layers 57. In this case, it is preferable that the fluorine concentration in the thermally diffused regions gradually increases toward the interface with the wiring sidewall layers 57. If the fluorine concentration has such distribution, adhesion between the wiring sidewall layers 57 and the inter-wiring insulating film 58 is improved and occurrence of delamination can be effectively suppressed. Also, it is preferable that the thermally diffused regions are formed with the thickness equal to or smaller than approximately 300 nanometers from the interface with the wiring sidewall layers 57.

In another preferred mode of the present invention, in the examples of FIGS. 7A and 7B and FIGS. 8A and 8B, the wiring sidewall layers 57 are heated to a temperature equal to or higher than, for example, 400 degrees Celsius, during process steps for manufacturing a semiconductor device according to the present invention, similarly to the examples mentioned above with respect to FIGS. 5A and 5B and FIGS. 6A and 6B. Due to such heating, thermal diffusion of fluorine occurs from the wiring sidewalls 57 comprising fluorine-containing silicon oxide to the inter-wiring insulating film 62 comprising Hydroxy Silsesquioxane. Therefore, thermally diffused regions in which dehydrogenation of Hydroxy Silsesquioxane has occurred and density thereof is lowered are formed in the inter-wiring insulating layer 62 comprising the Hydroxy Silsesquioxane and near the interface between the inter-wiring insulating layer 62 and the wiring sidewall layers 57. It is considered that the reasons why density of Hydroxy Silsesquioxane is lowered is because fluorine thermally diffused from the wiring sidewall layers 57 reacts with hydrogen of Hydroxy Silsesquioxane to cause etching function. In the thermally diffused regions, since the density of Hydroxy Silsesquioxane is lowered, dielectric constant is also decreased. This decrease in dielectric constant contributes to reduction of parasitic capacitance between wirings. It is preferable that density of the Hydroxy Silsesquioxane in the thermally diffused regions gradually decreases toward the interface with the wiring sidewall layers 57. If the density has such distribution, adhesion between the wiring sidewall layers 57 and the inter-wiring insulating film 62 is improved and occurrence of delamination can be effectively suppressed. Also, it is preferable that the thermally diffused regions are formed with the thickness equal to or smaller than approximately 300 nanometers from the interface with the wiring sidewall layers 57.

In the semiconductor devices and method of manufacturing them according to the present invention, wiring sidewall layers including fluorine-containing silicon oxide are formed on side edge portions of each wiring formed on a semiconductor substrate. Therefore, dielectric constant of the wiring sidewall layers is decreased and parasitic capacitance between wirings and between wiring layers can be decreased. Therefore, when, for example, an inter-conductor or inter-wiring insulating layer comprising the fluorine-containing silicon oxide is formed between such wirings, it is possible to raise fluorine concentration in the wiring sidewall layers to lower dielectric constant thereof and to decrease parasitic capacitance between wirings, and to lower fluorine concentration of the inter-wiring insulating layer to aviod delamination of the inter-wiring insulating layer. In this case, the wiring sidewall layers themselves do not contact, for example, the semiconductor substrate in large area, and, therefore, do not cause delamination.

Also, when an inter-wiring insulating film or layer comprising Hydroxy Silsesquioxane is formed between the wirings, it is possible to raise fluorine concentration in the wiring sidewall layers and to decrease the dielectric constant of the wiring sidewall layers themselves. Further, during a manufacturing process of a semiconductor device, the density of Hydroxy Silsesquioxane near the wiring sidewall layers is lowered due to the thermal diffusion of fluorine from the wiring sidewall layers, thereby dielectric constant thereof is also decreased. Therefore, it is not necessary to perform improvement process of the quality of the Hydroxy Silsesquioxane itself which incurs complication of manufacturing process.

Figure 9:
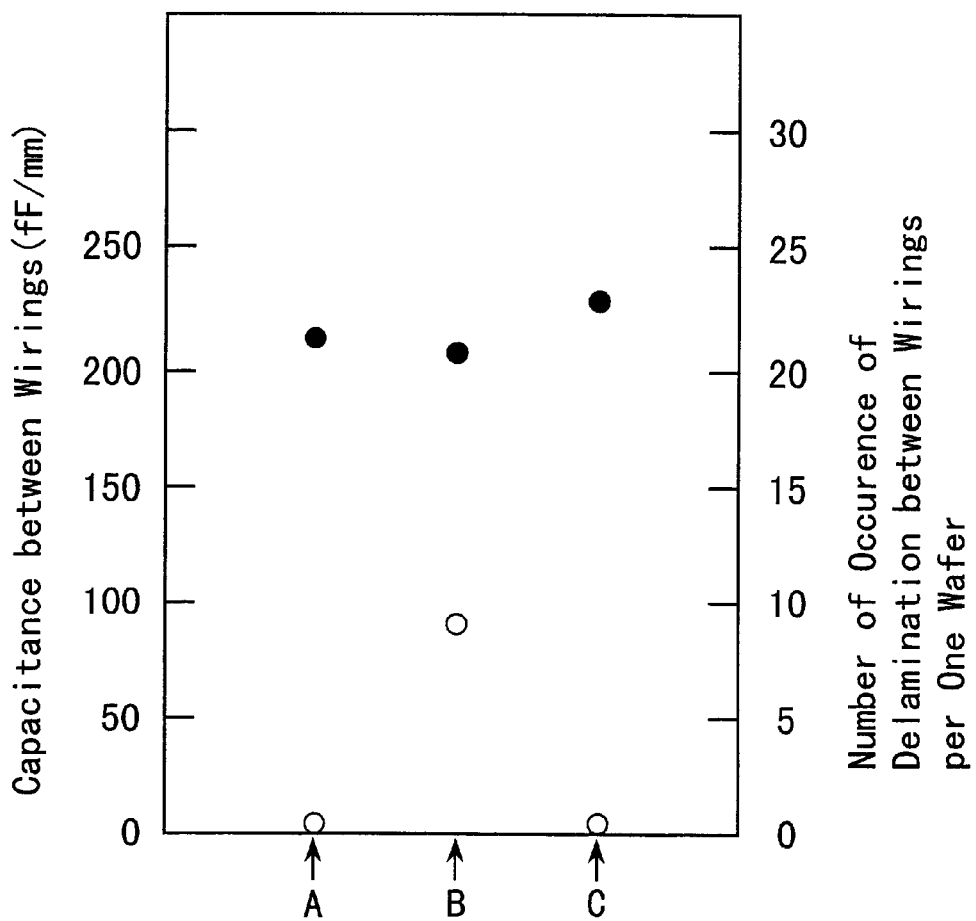
FIG. 9 is a graph illustrating advantageous effects of the present invention in comparison with a prior art.
Figure 10:
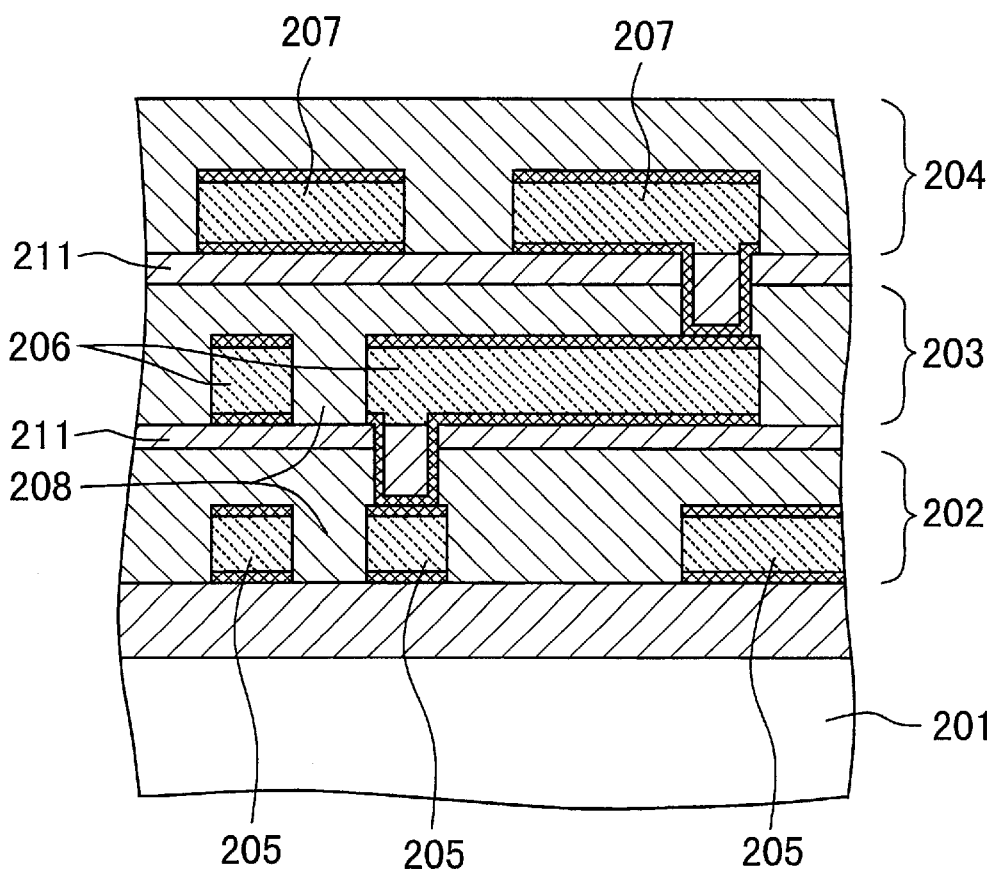
FIG. 10 is a partial cross sectional view illustrating a structure of a conventional semiconductor device.
Figure 11:
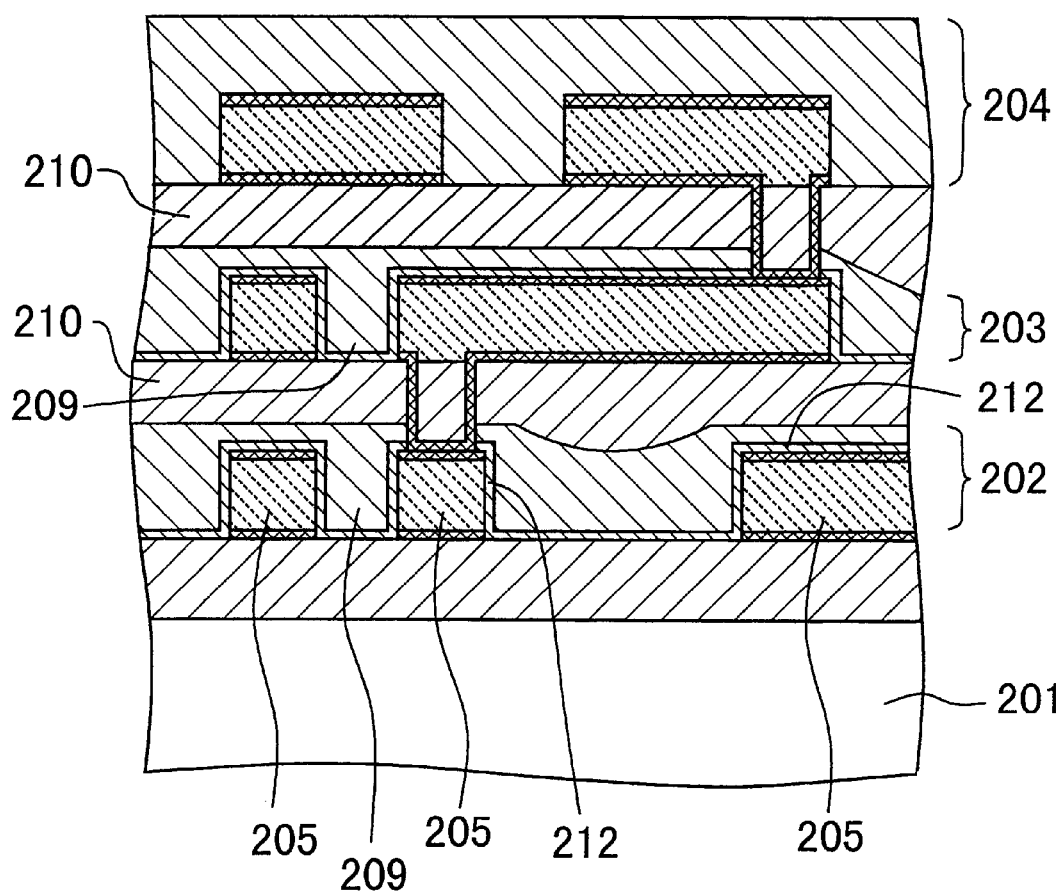
FIG. 11 is a partial cross sectional view illustrating a structure of another conventional semiconductor device.

With reference to FIG. 9, effects of the present invention will be explained concretely. As shown in FIG. 9, in the prior art semiconductor device of FIG. 10, when the inter-wiring insulating film 208 is formed by using SiOF film having high fluorine concentration, for example, 8 atomic percent (see item B in FIG. 9), in the condition that width of wiring is 0.3 micrometer, space between wirings is 0.3 micrometer and thickness of wiring is 0.6 micrometer, rate of occurrence of delamination of inter-wiring insulating film becomes high. Also, when, in the prior art semiconductor device of FIG. 10, concentration of fluorine of the inter-wiring insulating film 208 is set to an ordinary value of, for example, 5 atomic percent (see item C in FIG. 9), the capacitance between wirings becomes large.

In the semiconductor device of the present invention having the structure shown in FIG. 1 and manufactured according to the method illustrated in FIGS. 5A and 5B and FIGS. 6A and 6B, when, for example, the wiring sidewall layers are formed by fluorine-containing silicon oxide having fluorine concentration of 8 atomic percent and the inter-wiring insulating film is formed by fluorine-containing silicon oxide having fluorine concentration of 5 atomic percent (see item A in FIG. 9), it is possible to almost avoid delamination of wirings and to effectively decrease capacitance between wirings, for example, by approximately 10 percent.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:
   a wiring in each of one or more wiring layers formed on a semiconductor substrate; and
   wiring sidewall layers which are formed on side edge portions of said wiring and which include fluorine-containing silicon oxide,
   an inter-wiring insulating film comprising fluorine-containing silicon oxide is formed on the outer surface of said wiring sidewall layers, the fluorine concentration in said fluorine-containing silicon oxide forming said inter-wiring insulating film is smaller than fluorine concentration of said fluorine-containing silicon oxide forming said wiring sidewall layers, and wherein thermally diffused regions of fluorine into which fluorine is thermally diffused from said wiring sidewall layers are formed in said inter-wiring insulating layer and near the interfaces with said wiring sidewall layers.

2. A semiconductor device as set forth in claim 1, wherein said one or more wiring layers comprise a plurality of wiring layers which are respectively disposed in height regions having different heights from said semiconductor substrate.

3. A semiconductor device as set forth in claim 1, wherein fluorine concentration in said fluorine containing silicon oxide forming said wiring sidewall layers is 7 through 11 atomic percent.

4. A semiconductor device as set forth in claim 1, wherein said wiring sidewall layers consist of fluorine-containing silicon oxide.

5. A semiconductor device as set forth in claim 4, wherein the thickness of each of said wiring sidewall layers consisting of fluorine-containing silicon oxide in the direction perpendicular to a side edge surface of said wiring is substantially 20 through 100 nanometers.

6. A semiconductor device as set forth in claim 1, wherein each of said wiring sidewall layers has a double layer structure having an inner wall layer comprising silicon oxide and formed on said side edge portions of said wiring and an outer wall layer comprising fluorine-containing silicon oxide and formed on the outer surface of said inner wall layer.

7. A semiconductor device as set forth in claim 6, wherein the thickness of said outer wall layer in the direction perpendicular to a side edge surface of said wiring is substantially 20 through 100 nanometers.

8. A semiconductor device as set forth in claim 1, wherein fluorine concentration in said fluorine-containing silicon oxide forming said inter-wiring insulating film is 3 through 7 atomic percent.

9. A semiconductor device as set forth in claim 1, wherein fluorine concentration in each of said thermally diffused regions of fluorine gradually increases toward the interface with said wiring sidewall layer.

10. A semiconductor device as set forth in claim 1, wherein each of said thermally diffused regions of fluorine is formed with a thickness equal to or smaller than 300 nanometers from the interface with said wiring sidewall layer.

11. A semiconductor device comprising:
    a wiring in each of one or more wiring layers formed on a semiconductor substrate; and
    wiring sidewall layers which are formed on side edge portions of said wiring and which include fluorine-containing silicon oxide,
    wherein an inter-wiring insulating film comprising Hydroxy Silsesquioxane is formed on the outer surfaces of said wiring sidewall layers, and
    wherein thermally diffused regions of fluorine into which fluorine is thermally diffused from said wiring sidewall layers and in which said Hydroxy Silsesquioxane is dehydrogenated and density of said Hydroxy Silsesquioxane is lowered are formed in said inter-wiring insulating layer and near the interfaces with said wiring sidewall layers.

12. A semiconductor device as set forth in claim 11, wherein said one or more wiring layers comprise a plurality of wiring layers which are respectively disposed in height regions having different heights from said semiconductor substrate.

13. A semiconductor device as set forth in claim 11, wherein fluorine concentration in said fluorine containing silicon oxide forming said wiring sidewall layers is 7 through 11 atomic percent.

14. A semiconductor device as set forth in claim 11, wherein said wiring sidewall layers consist of fluorine-containing silicon oxide.

15. A semiconductor device as set forth in claim 14, wherein the thickness of each of said wiring sidewall layers consisting of fluorine-containing silicon oxide in the direction perpendicular to a side edge surface of said wiring is substantially 20 through 100 nanometers.

16. A semiconductor device as set forth in claim 11, wherein each of said wiring sidewall layers has a double layer structure having an inner wall layer comprising silicon oxide and formed on said side edge portions of said wiring and an outer wall layer comprising fluorine-containing silicon oxide and formed on the outer surface of said inner wall layer.

17. A semiconductor device as set forth in claim 16, wherein the thickness of said outer wall layer in the direction perpendicular to a side edge surface of said wiring is substantially 20 through 100 nanometers.

18. A semiconductor device as set forth in claim 11, wherein density of said Hydroxy Silsesquioxane in each of said thermally diffused regions of fluorine gradually decreases toward the interface with a said wiring sidewall layer.

19. A semiconductor device as set forth in claim 11, wherein each of said thermally diffused regions of fluorine is formed with a thickness equal to or smaller than 300 nanometers from the interface with said wiring sidewall layer.

* * * * *